United States Patent [19]

Morrill

[11] Patent Number: 6,160,429
[45] Date of Patent: Dec. 12, 2000

[54] POWER-ON RESET CIRCUIT

[75] Inventor: David P. Morrill, Scarborough, Me.

[73] Assignee: Fairchild Semiconductor Corporation, South Portland, Me.

[21] Appl. No.: 09/190,308

[22] Filed: Nov. 12, 1998

[51] Int. Cl.[7] .................................................. H03K 17/22
[52] U.S. Cl. .......................................... 327/143; 327/198
[58] Field of Search .................................... 327/143, 198, 327/74, 77, 58, 53, 55, 78, 89

[56]  References Cited

U.S. PATENT DOCUMENTS

| 4,309,627 | 1/1982 | Tabata | 327/143 |
| 4,874,965 | 10/1989 | Campardo et al. | 327/143 |
| 5,378,936 | 1/1995 | Kokubo et al. | 327/143 |

Primary Examiner—Toan Tran
Attorney, Agent, or Firm—Pierce Atwood; Chris A. Caseiro

[57] ABSTRACT

A fabrication- and temperature-independent power-on reset circuit for providing improved control over live insertion of integrated circuitry. The reset circuit includes a comparator having an output terminal and two input terminals, one positive and one negative. One of the two terminals is coupled to a first threshold turn-on branch and the other terminal is coupled to a second threshold turn-on branch. Both threshold branches are referenced to ground but they supply different initial potentials to the terminals of the comparator. As a result, one terminal acting as the reference terminal holds the circuit output of the present invention at a potential designed to halt circuit power-on regardless of independent enable control pin signals. The other of the two terminals does not trigger switching of the comparator output until after a common supply power rail reaches a desired potential at initial turn-on. Referencing of the two threshold branches of the circuit to ground ensures that fabrication and temperature vagaries are effectively cancelled out.

9 Claims, 2 Drawing Sheets

POWER-ON RESET CIRCUIT

BACKGROUND OF THE INVENTION

1. Field of the Invention

The present invention relates to circuitry for generating power-on reset signals for transmission to integrated circuit systems. In particular, the present invention relates to a power-on reset circuit that operates to hold off power-on reset until the high-potential power supply rail reaches a defined potential. More particularly, the present invention relates to power-on reset circuitry that is relatively independent of fabrication and operating temperature vagaries.

2. Description of the Prior Art

Power-on reset circuits are designed to transmit to semiconductor-based systems signals to enable operation of such systems only when a common high-potential power rail reaches a certain minimum potential. These power-on reset circuits may be used to enable "hot" or live insertion of systems or subsystems such as circuit boards that are initially unpowered into extended coupled circuitry that is powered. The power-on reset circuitry is supposed to protect the unpowered system or subsystem from significant initial potential variations that may cause damage or unexpected operational anomalies in the circuitry that is inserted into the active system. In effect, the power-on reset circuit is designed to hold off enabling activation of the subsystem until the power rail potential is suitable for activation of that particular subsystem.

Power-on rest circuits come in a variety of designs. One circuit that has been found to be adequate in prior systems is illustrated in a simplified diagram in FIG. 1. The prior reset circuit includes a voltage divider formed of resistors R10 and R11, wherein R10 is tied to the common high-potential power rail Vcc and R11 is coupled to the common low-potential power rail GND. As the potential of Vcc begins to rise, the output of the circuit at OUTPUT essentially tracks Vcc less the drop across resistor R12. Logic functions coupled to OUTPUT define whether that logic high signal holds off of the powering up of the circuitry to which OUTPUT is coupled. In the meantime, the voltage divider, and in particular the potential at the low-potential node of R10, delays the turning on of pull-down transistor Q1. Only when there is enough current at the base of Q1 will that transistor turn on and thereby pull the potential at OUTPUT down to a logic low level in a manner that enables power-on reset of the circuitry to which OUTPUT is coupled. The resistance values of R10 and R11 define the Vcc potential at which Q1 is turned on and therefore the potential at which the signal at OUTPUT switches.

While the circuitry shown in FIG. 1 works well for circuitry in which relatively large swings in logic levels are acceptable, its design is subject to fabrication variations and temperature changes. That is, variations in resistances and transistor I-C characteristics will change the point at which the potential at Vcc is sufficient to switch the output at OUTPUT. Similarly, wide temperature swings of the type that may be experienced by semiconductor devices will also affect operational response. As a result, it is possible to have the potential at which Q1 is turned on change by 1 volt or more—an unacceptable condition as logic swing requirements become tighter. To an extent, this problem is related to the fact that power-on reset circuits are generally referenced to the Vcc rail rather than the GND rail. It is to be noted that such referencing, as well as the fabrication and temperature sensitivity, can also lead to a change in the reset circuit's ability to provide a power-on signal at a well-defined minimum potential. The result can be undesirable delays in operation of that extended circuitry, particularly when it forms part of a larger operating system.

Therefore, what is needed is a power-on reset circuit that is less dependent on process vagaries and temperature swings than that of prior reset circuits. What is also needed is a power-on reset circuit that is referenced to the more certain low-potential power rail. Further, what is needed is a power-on reset circuit that enables transmission of a power-on signal at a selectable minimum potential of the high-potential power rail and within a more well-defined range of potentials.

SUMMARY OF THE INVENTION

It is an object of the present invention to provide a power-on reset circuit that is less dependent on process vagaries and temperature swings than that of prior reset circuits. It is also an object of the present invention to provide a power-on reset circuit that is referenced to the low-potential power rail. It is further an object of the present invention to provide a power-on reset circuit that enables transmission of a power-on signal at a selectable minimum potential of the high-potential power rail and within a better-defined range of potentials.

These and other objects are achieved in the present invention by creating a power-on reset circuit having a comparator and two threshold-defining branches coupled to the comparator. The comparator output provides the signal for defining the logic state of a power-on reset signal. The comparator and the threshold branches are configured to ensure that the logic signal required to activate coupled circuitry is not triggered until after the high-potential power rail Vcc reaches a specified potential. That is achieved by providing in the first and second threshold branches devices, each coupled to Vcc, that develop different potentials at the positive and negative terminals of the comparator as Vcc rises. Additionally, each threshold branch includes a ground-referenced device coupled to the low-potential power rail GND, wherein the ground-referenced device of the first branch provides substantially the same potential drop as the ground-referenced device of the second branch. This ground referencing provides improved independence from fabrication and temperature changes as compared to the sensitivity to those conditions experienced with the high-potential referencing of prior power-on reset circuits. One terminal of the comparator is coupled to the first threshold branch between its two potential-changing devices and the other terminal of the comparator is coupled to the second threshold branch between its two potential changing devices.

For illustration purposes, the power-on reset circuit of the present invention is designed such that the positive terminal of the comparator defines the reference voltage. It is to be understood, however, that it may also be designed with the negative terminal as the reference. In any event, continuing with the noted illustration, when the voltage at the negative terminal exceeds the voltage at the positive terminal, the output signal switches from one logic value to the other, e.g., high to low or low to high. In the preferred embodiment of the circuit, the comparator's positive terminal is the gate of an N-type metal oxide semiconductor (NMOS) transistor and its negative terminal is the gate of a second NMOS transistor. The first transistor's gate is tied to the first threshold branch and the second transistor's gate is tied to the second threshold branch. The potential drop at an upper stage of the first threshold branch is less than the potential drop at an upper stage of the second threshold branch, thereby ensuring that the first transistor will turn on first to establish the reference at the positive terminal. Only when the potential at Vcc exceeds some desired value will the potential at the second comparator transistor's gate be high enough to turn that transistor on and thereby cause a switching of the comparator's output.

The power-on reset circuit of the present invention provides the advantage of a reduction in the range of Vcc potentials that trigger reset in that it is less fabrication and/or temperature dependent than prior reset circuits. It also provides improved performance in the control of the level of the Vcc potential at which reset will trigger. While the illustration noted above has been made with regard to having the positive terminal of the comparator be the reference point, it is to be understood that the gate couplings for the two comparator transistors may be reversed such that the gate of the negative terminal is coupled to the first threshold branch and the gate of the second transistor is coupled to the second threshold branch so that the output of the comparator will switch from low to high rather than high to low.

The power-on reset circuit of the present invention is a simple means of reducing the turn-on potential range associated with a reset signal. It also enables improved definition of a minimum turn-on potential. These and other advantages of the present invention will become apparent upon review of the detailed description, the accompanying drawings, and the appended claims.

DESCRIPTION OF THE PREFERRED EMBODIMENT OF THE INVENTION

Figure 2:
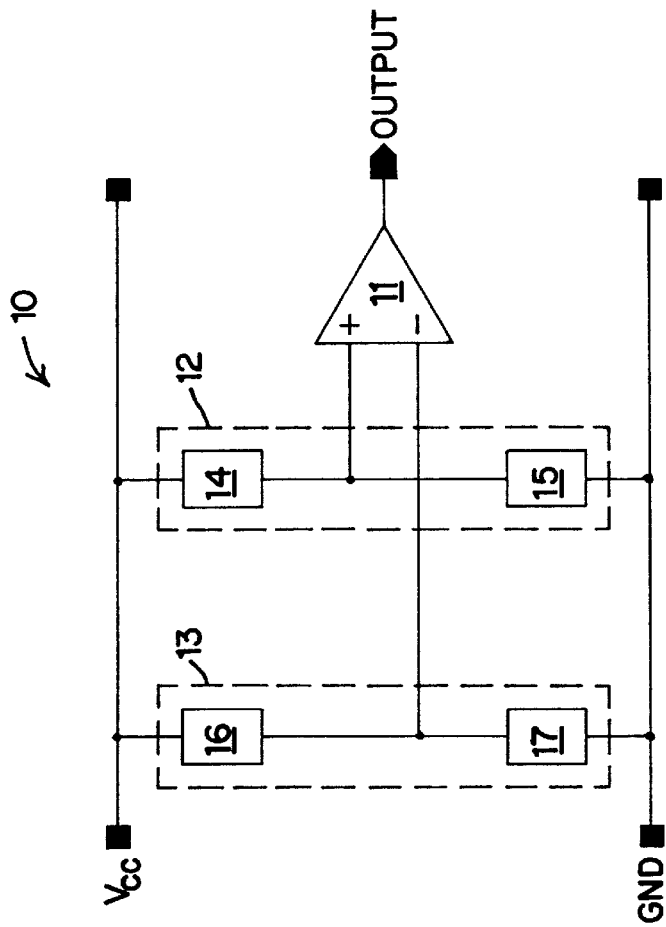
FIG. 2 is a simplified circuit diagram showing the power-on reset circuit of the present invention including a comparator having positive terminal supply branch and a negative terminal supply branch.
Figure 1:
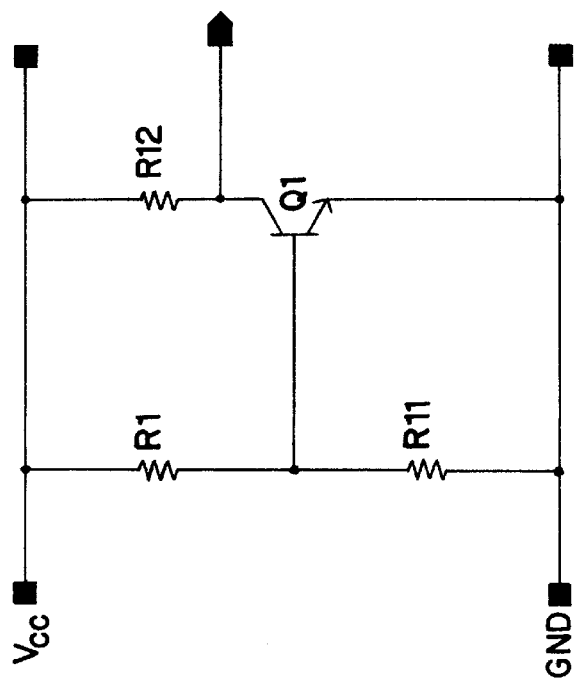
FIG. 1 is a simplified circuit diagram showing a generic prior-art power-on reset circuit.

A simplified illustration of a power-on reset buffer circuit 10 of the present invention is shown in FIG. 2. The reset circuit 10 includes a comparator 11 supplied by a high-potential power rail Vcc and a low-potential power rail GND. An output of the comparator 11 is coupled to node OUTPUT that is linked to reset sub-circuitry of any integrated circuit device requiring power-on reset regulation. The reset circuit 10 further includes a first threshold branch 12 and a second threshold branch 13. The first branch 12 includes a first potential drop device 14 and a second potential drop device 15, wherein a positive terminal of the comparator 11 is coupled to the first branch 12 between the first device 14 and the second device 15. The second branch 13 includes a third potential drop device 16 and a fourth potential drop device 17, wherein a negative terminal of the comparator is coupled to the second branch 13 between the third device 16 and the fourth device 17.

The circuit 10 is designed such that the positive terminal of the comparator 11 defines the reference voltage. When the voltage at the negative terminal exceeds the voltage at the positive terminal, the OUTPUT signal is low. When the positive terminal voltage is greater than that of the negative terminal, OUTPUT is high. In order to ensure that the circuit 10 operates substantially independent of fabrication vagaries and any defined operating temperature range, branches 12 and 13 are both referenced to ground GND potential. As a result, fabrication and temperature changes affect both branches in the same way and are therefore effectively cancelled. In that regard, the comparator 11 continues to compare equivalent differences in the potentials associated with the first branch 12 and the second branch 13.

With continuing reference to FIG. 2, and related to the desire to maintain reference to GND, device 15 of branch 12 and device 17 of branch 13 preferably provide substantially equivalent potential drops. On the other hand, it is important to develop a difference in potential between that experienced at the positive terminal and that experienced at the negative terminal of the comparator 11 through device 14 of branch 12 and device 16 of branch 13. That is achieved in the present invention by including as part of device 16 one or more components that prevent the potential at the negative terminal of the comparator 11 from reaching and exceeding the potential at the positive terminal until such time as the potential of Vcc reaches a desired minimum value. On the other hand, the device 14 of branch 12 is designed to ensure that the potential at the positive terminal of the comparator 11 is greater than the potential at the negative terminal during the period of time that the potential of Vcc is rising to the required minimum level that triggers switching of the comparator 11 output.

Figure 3:
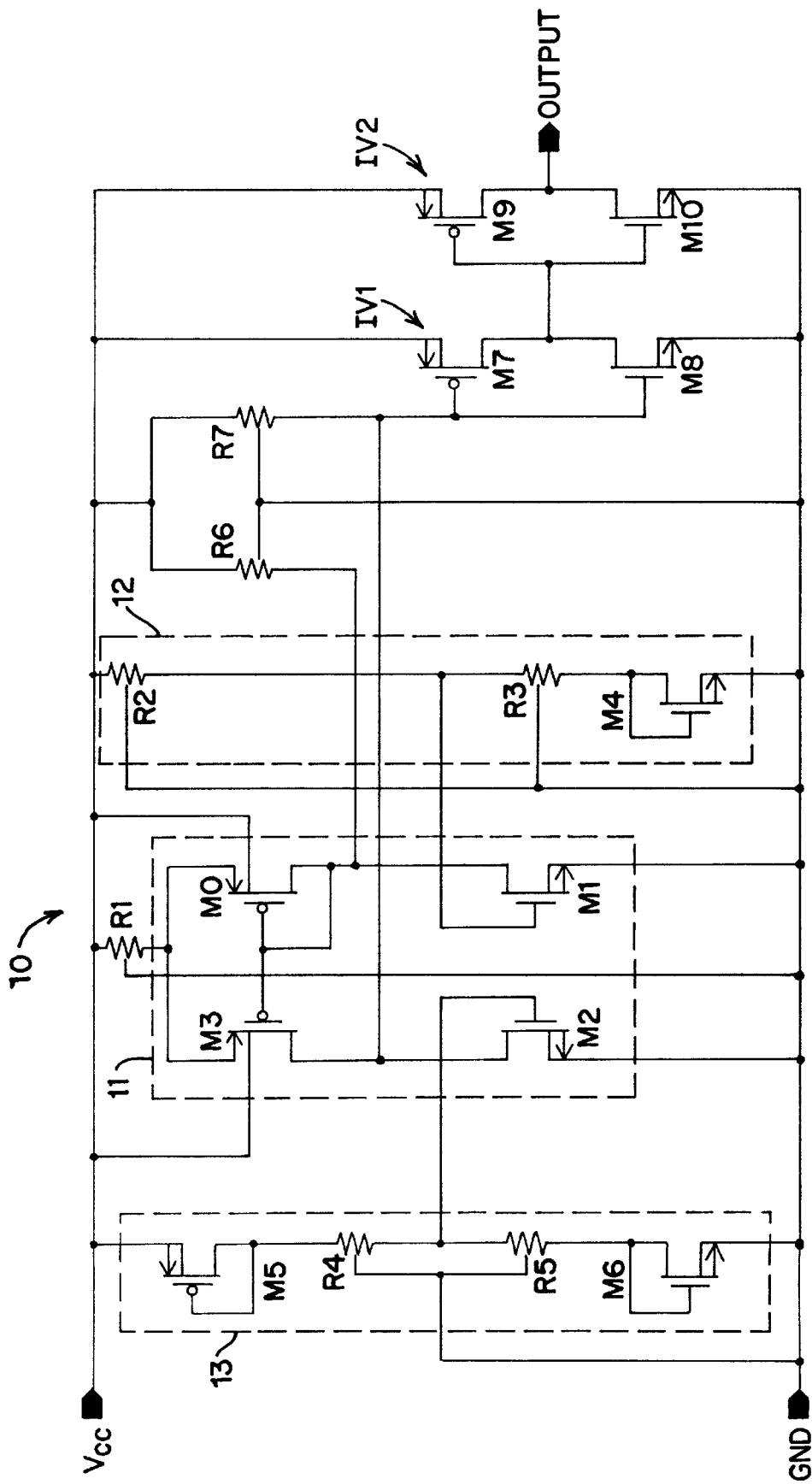
FIG. 3 is a detailed circuit diagram of a preferred design of the power-on reset circuit of the present invention including preferred designs of the comparator and its supply branches.

FIG. 3 presents a preferred design of the circuit 10 described generally with respect to FIG. 2. The comparator 11 includes first comparator transistor M0, second comparator transistor M1, third comparator transistor M2, and fourth comparator transistor M3. Transistors M0 and M3 are preferably PMOS transistors with common gates, and transistors M1 and M2 are preferably NMOS transistors. The potential drop associated with optional resistive element R1 may also form part of the comparator 11. Branch 12 includes first resistive element R2, second resistive element R3, and ground-referencing transistor M4. Branch 13 includes a diode means that is preferably a diode-wired transistor M5, first resistive element R4, second resistive element R5, and ground-referencing transistor M6. Transistor M5 is preferably a PMOS transistor while transistors M4 and M6 are preferably NMOS transistors.

With continue reference to FIG. 3, the primary components of the circuit 10 are coupled as follows. Resistive elements R1 and R2 each has a high-potential node coupled to high-potential power rail Vcc. The low-potential node of R1 is coupled to the source of M0 and the source of M3 of the comparator 11. The gates of M0 and M3 are coupled together and are also coupled to the drain of M0 and the drain of M1. The drain of M3 is coupled to the drain of M2 and the sources of transistors M1 and M2 are both coupled to low-potential power rail GND. The drains of transistors M0 and M1 are optionally coupled to Vcc through optional resistive element R6 provide enhanced low-Vcc potential performance, e.g., Vcc<0.5V, by charging M0 and M1 under those conditions.

The gate of transistor M1 is the positive terminal of the comparator 11. It is coupled to the low-potential node of R2. The gate of transistor M2 is the negative terminal of the comparator 11. It is coupled to the low-potential node of R4. The drain of M2 is the output of the comparator 11 and is coupled to OUTPUT of the circuit 10 that is couplable to integrated circuitry not shown.

With reference to branch 12, R2 has its low-potential node coupled to the gate of M1, as indicated, and to the high-potential node of R3. R3 has its low-potential node coupled to the drain of diode-wired transistor M4. The source of M4 is coupled to GND. Diode-wired transistor M5 has its source coupled to Vcc. The drain of M5 is coupled to the high-potential node of a voltage divider including resistive elements R4 and R5. The low-potential node of the voltage divider is coupled to the source of diode-wired transistor M6, which has its gate tied to GND.

In operation, the circuit 10 provides for fabrication- and temperature-independent control of the output of the potential of Vcc on power-up in a tristate configuration as follows. Initially, with Vcc off, all circuit components are essentially at GND potential. As Vcc begins to rise, R2 drives the gate of M1 to a potential substantially equivalent to the potential across R3 and the threshold turn-on voltage drop (Vt) across M4. For the transistors used to form the components of the present invention Vt is generally about 0.7V. At the same time, the output OUTPUT of the circuit tracks Vcc and therefore produces what is the equivalent of a logic high. For the purpose of the description of the present invention, it is to be understood that a logic high at OUTPUT blocks the power-on reset of the circuitry to which circuit 10 is coupled. Optionally, the circuit 10 may include resistive element R7 to charge the negative terminal of the comparator 11 at low Vcc potentials, e.g., Vcc<0.5V. However, R7 must also be sized to ensure that the branch of comparator 11 including transistor M2, when on, provides the path of least resistance for transmission of the output signal OUTPUT.

During the rise of Vcc, transistor M5 turns on when Vcc reaches Vt. However, the potential drop across R4 yields a potential at the gate of M2 (the negative terminal of the comparator 11) that is less than the potential at the gate of M1 (the positive terminal) and so M2 remains off. Only when the potential of Vcc reaches the equivalent of the Vt of M5 plus the drop across R4 plus the Vt of M2 will M2 turn on. With M2 on, the branch including R1, M3, and M2 conducts and the output of the comparator 11 (the drains of transistors M2 and M3) is pulled low. For the purpose of the present invention, this will trigger a reset signal corresponding to a Vcc potential equivalent to 2 Vt plus the drop across R4, which drop can be selected for a desired minimum Vcc power-on value.

It is to be noted that the circuit 10 optionally includes inverter IV1 including CMOS transistors M7 and M8, and inverter IV2 including CMOS pull-up transistor M9 and pulldown transistor M10. Of course, less or more inverters may be employed, as well as other sorts of logic functions that will provide the desired output at OUTPUT. In addition, the elements shown as diode-wired MOS transistors, including transistors M4, M5, and M6, may be any sort of diode means including, but not limited to diodes, diode-wired MOS transistors and diode-wired bipolar transistors.

The design of the circuit described with reference to FIG. 3 provides the advantage of a reduction in the range of Vcc potentials that trigger reset in that it is less fabrication and/or temperature dependent than prior reset circuits. It also provides improved performance in the control of the level of the Vcc potential at which reset will trigger. While reference to the design of FIG. 3 has been made in regard to having transistor M1 on prior to turning on transistor M2, it is to be understood that the gate couplings for those two transistor may be reversed such that the gate of M1 is coupled to the low-potential node of R4 and the gate of M2 is coupled to the low-potential node of R2 so that the output of the comparator 11 will move from low to high rather than high to low. Of course, in order to complete that transition, the output node OUTPUT would initially have to be tied to GND rather than Vcc.

While the invention has been described with reference to particular example embodiments, it is intended to cover all modifications and equivalents within the scope of the following claims.

What is claimed is:

1. A power-on reset buffer circuit having an output node, the circuit comprising:

a. a comparator having a positive input terminal, a negative input terminal, and an output coupled to the output node of the circuit, wherein said comparator is powered by a high-potential power rail and a low-potential power rail;

b. a first threshold branch having an output coupled to said positive terminal of said comparator and a low-potential node coupled to the low-potential power rail, wherein said first threshold branch includes a first potential drop device and a second potential drop device, wherein said first potential drop device includes a resistor having a high-potential node coupled to the high-potential power rail and a low-potential node coupled to said positive terminal of said comparator; and c. a second threshold branch having an output coupled to said negative terminal of said comparator and a low-potential node coupled to the low-potential power rail, wherein said second threshold branch includes a third potential drop device and a fourth potential drop device, wherein said third potential drop device includes a diode means and a resistor, said diode means having a high-potential node coupled to the high-potential power rail and a low-potential node coupled to a high-potential node of said resistor of said third potential drop device, and wherein a low-potential node of said resistor of said third potential drop device is coupled to said negative terminal of said comparator, wherein said first threshold branch is designed to produce at said output of said first threshold branch a first potential at said positive terminal that is higher than a second potential supplied by said second threshold branch at said output of said second threshold branch to said negative terminal, and wherein said second potential drop device and said fourth potential drop device provide substantially equivalent potential drops.

2. The circuit as claimed in claim 1 wherein said diode means is a diode.

3. The circuit as claimed in claim 1 wherein said diode means is a diode-wired PMOS transistor.

4. The circuit as claimed in claim 1 wherein said positive terminal of said comparator is a gate of a first NMOS transistor and said negative terminal of said comparator is a gate of second NMOS transistor.

5. A power-on reset buffer circuit having an output node, the circuit comprising:

a. a comparator having a positive input terminal, a negative input terminal, and an output coupled to the output node of the circuit, wherein said comparator is powered by a high-potential power rail and a low-potential power rail;

b. a first threshold branch having an output coupled to said positive terminal of said comparator and a low-potential node coupled to the low-potential power rail, wherein said first threshold branch includes a first potential drop device and a second potential drop device, wherein said first potential drop device includes a resistor having a high-potential node coupled to the high-potential power rail and a low-potential node coupled to said positive terminal of said comparator; and c. a second threshold branch having an output coupled to said negative terminal of said comparator and a low-potential node coupled to the low-potential power rail, wherein said second threshold branch includes a third potential drop device and a fourth potential drop device, wherein said third potential drop device includes a diode means and a resistor, said diode means having a high-potential node coupled to the high-potential power rail and a low-potential node coupled to a high-potential node of said resistor of said third potential drop device, and wherein a low-potential node of said resistor of said third potential drop device is coupled to said negative terminal of said comparator, wherein said first threshold branch is designed to produce at said output of said first threshold branch a first potential at said negative terminal that is higher than a second potential supplied by said second threshold branch at said output of said second threshold branch to said positive terminal, and wherein said second potential drop device and said fourth potential drop device provide substantially equivalent potential drops.

6. The circuit as claimed in claim 5 wherein said diode means is a diode.

7. The circuit as claimed in claim 5 wherein said diode means is a diode-wired PMOS transistor.

8. The circuit as claimed in claim 5 wherein said positive terminal of said comparator is a gate of a first NMOS transistor and said negative terminal of said comparator is a gate of second NMOS transistor.

9. A power-on reset buffer circuit having an output node, the circuit comprising:

a. a comparator having a first NMOS transistor and a second NMOS transistor, wherein a gate of said first NMOS transistor is a positive terminal of said comparator, wherein a gate of said second NMOS transistor is a positive terminal of said comparator, and an output coupled to the output node of the circuit, wherein said comparator is powered through a high-potential power rail and a low-potential power rail;

b. a first threshold branch having a first resistor, a second resistor, and a first diode-wired NMOS transistor, wherein a high-potential node of said first resistor is coupled to said high-potential power rail and a low-potential node of said first resistor is coupled to a high-potential node of said second resistor and to said gate of said first NMOS transistor, and wherein a drain of said first diode-wired NMOS transistor is coupled to a low-potential node of said second resistor and a source of said first diode-wired NMOS transistor is coupled to said low-potential power rail; and c. a second threshold branch having a diode-wired PMOS transistor, a third resistor, a fourth resistor, and a second diode-wired NMOS transistor, wherein said PMOS transistor has a source coupled to said high-potential power rail and a drain coupled to a high-potential node of said third resistor, wherein a low-potential node of said third resistor is coupled to a high-potential node of said fourth resistor and to said gate of said second NMOS transistor of said comparator, wherein a low-potential node of said fourth resistor is coupled to a drain of said second diode-wired NMOS transistor, and wherein a source of said second diode-wired NMOS transistor is coupled to said low-potential power rail.

* * * * *